(12) United States Patent
Kashiwaya et al.

(10) Patent No.: US 7,217,944 B2
(45) Date of Patent: May 15, 2007

(54) PROCESS AND APPARATUS FOR PRODUCING EVAPORATED PHOSPHOR SHEETS AND AN EVAPORATED PHOSPHOR SHEET PRODUCED BY MEANS OF SUCH PROCESS AND APPARATUS

(75) Inventors: Makoto Kashiwaya, Kanagawa (JP); Junji Nakada, Kanagawa (JP); Yasuo Iwabuchi, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 10/917,510

(22) Filed: Aug. 13, 2004

(65) Prior Publication Data

US 2005/0056798 A1    Mar. 17, 2005

(30) Foreign Application Priority Data

Aug. 13, 2003   (JP)   ............................. 2003-293161
Jun. 10, 2004   (JP)   ............................. 2004-172869

(51) Int. Cl.
*G01N 23/04* (2006.01)

(52) U.S. Cl. .................................................. 250/580
(58) Field of Classification Search ................. 250/580
See application file for complete search history.

(56) References Cited

U.S. PATENT DOCUMENTS 4,390,571 A * 6/1983 Cosgrove et al. ........... 427/431
4,415,605 A * 11/1983 Davis et al. ................... 427/65
4,500,443 A * 2/1985 Taya et al. ............ 252/301.4 P
5,951,915 A * 9/1999 Hase et al. ........... 252/301.4 F
2002/0017245 A1* 2/2002 Tsubaki et al. .............. 118/718
2002/0041977 A1* 4/2002 Iwabuchi et al. ........... 428/690
2003/0222224 A1* 12/2003 Maezawa et al. ........ 250/484.4

* cited by examiner

*Primary Examiner*—David Porta
*Assistant Examiner*—Marcus Taningco
(74) *Attorney, Agent, or Firm*—Sughrue Mion, PLLC

(57) ABSTRACT

The process and apparatus introduce a carrier gas into a vacuum evaporation chamber, evaporate a film forming material from a evaporation source and deposit the evaporated film forming material on a substrate in sheet form to form a stimulable phosphor layer, thereby producing a evaporated phosphor sheet having a stimulable phosphor layer formed on the substrate. The stimulable phosphor layer is formed with substantially all areas of the evaporation source except opening for evaporation being masked to block movement of heat toward the substrate. The evaporated phosphor sheet includes the substrate and a CsBr:Eu evaporated stimulable phosphor layer deposited on the substrate. A maximum intensity of instantaneous light emission from the stimulable phosphor layer at 640 nm upon excitation by uv radiation is lower than a maximum intensity of the instantaneous light emission at 440 nm.

22 Claims, 2 Drawing Sheets

PROCESS AND APPARATUS FOR PRODUCING EVAPORATED PHOSPHOR SHEETS AND AN EVAPORATED PHOSPHOR SHEET PRODUCED BY MEANS OF SUCH PROCESS AND APPARATUS

BACKGROUND OF THE INVENTION

This invention relates to a process and an apparatus for producing evaporated phosphor sheets and more particularly to a process and an apparatus for producing evaporated phosphor sheets with a protective measure being so taken that the heat of radiation from sections of evaporating film forming materials will affect neither the substrate on which a film is being deposited nor any other parts, thereby ensuring that the phosphor sheet as produced will not have been subjected to thermal history. The invention also relates to the evaporated phosphor sheet thus obtained by means of such process and apparatus. There are known a class of phosphors which accumulate a portion of applied radiations (e.g. x-rays, α-rays, β-rays, γ-rays, electron beams and uv radiation) and which, upon stimulation by exciting light such as visible light, give off photostimulated luminescence in proportion to the accumulated energy of radiation. Such phosphors, called stimulable phosphors, are employed in medical and various other applications.

An exemplary application is a radiation image information recording and reproducing system which employs a stimulable phosphor sheet having a layer formed of the stimulable phosphor. The layer is hereunder referred to as the phosphor layer and the stimulable phosphor sheet is hereunder referred to simply as a phosphor sheet. The phosphor sheet is sometimes called a radiation image transforming panel but in the following description, the term "phosphor sheet" is used throughout. The radiation image information recording and reproducing system has already been commercialized by various companies including Fuji Photo Film Co., Ltd. which has marketed FCR (Fuji Computed Radiography, trade name).

In the system, radiation image information about the subject such as the human body is recorded on the phosphor sheet (more specifically, the phosphor layer) and thereafter the phosphor sheet is scanned two-dimensionally with exciting light such as laser light to produce photostimulated luminescence which, in turn, is read photoelectrically to yield an image signal and an image reproduced on the basis of the image signal is output as a visible image, typically on a recording material such as a photosensitive material or to a display device such as CRT. After reading has been finished, the residual image is erased from the phosphor sheet for subsequent cyclic use.

The phosphor sheet is typically produced by a process comprising the steps of preparing a coating solution having the particles of a stimulable phosphor dispersed in a solvent containing a binder, etc., applying the coating solution to a support in sheet form that is made of glass, resin, etc. and drying the applied coating to form a phosphor layer.

Phosphor sheets are also known that are made by forming a phosphor layer on a support through methods of physical vapor deposition (vapor-phase film formation) such as vacuum evaporation and sputtering.

The phosphor layer formed on the support by physical vapor deposition has excellent characteristics. First, it contains less impurities since it is formed under vacuum; in addition, it is substantially free of any substances other than the stimulable phosphor, as exemplified by the binder, so it has high uniformity in performance and still assures very high luminous efficiency.

Vacuum evaporation involves evaporating film forming materials from evaporation sources in a vacuum chamber and depositing a phosphor layer on a substrate's surface.

The phosphor layer of the phosphor sheet is very thick, ranging from about 200 μm through a typical value of about 500 μm up to sometimes more than 1000 μm. In order to ensure that such thick phosphor layers are deposited uniformly, columns of good shape need to be formed by adopting the approach of introducing a gas and, in addition, uniform film thickness must be assured by thickness measurement so as to provide better x-ray characteristics.

A problem with the approach of introducing a gas technique is that the percentage of the evaporated particles of the film forming materials that arrive at the substrate (i.e., the percent deposition on the substrate) decreases as the number of gas molecules in the vacuum chamber increases. This difficulty may be dealt with by shortening the distance between the substrate and the source of vaporization of the film forming material within the vacuum chamber (namely, by bringing the two members closer to each other than in the prior art).

However, this approach of shortening the distance between the substrate and the source of vaporization of the film forming material gives rise to another problem that has been absent from the prior art, that is, the heat of radiation from the evaporation source causes excessive heating of the substrate. As is well known, the x-ray characteristics of stimulable phosphors (and phosphor sheets employing them) can potentially deteriorate if they are subjected to thermal history, so excessive heating of the substrate is by no means preferred.

SUMMARY OF THE INVENTION

The present invention has been accomplished under those circumstances and has as an object providing a process for producing evaporated phosphor sheets with a protective measure being so taken that the heat of radiation from sections of evaporating film forming materials will affect neither the substrate on which a film is being deposited nor any other parts, thereby ensuring that the phosphor sheet as produced will not have been subjected to thermal history.

Another object of the invention is to provide an apparatus for producing such evaporated phosphor sheets.

Still another object of the invention is to provide evaporated phosphor sheets that are produced by the above-described process.

There, according to the first aspect of the invention in order to attain the object described above, there is provided a process for producing a evaporated phosphor sheet, comprising the steps of: introducing a carrier gas into a vacuum evaporation chamber; evaporating at least one film forming material from at least one evaporation source; and depositing said at least one evaporated film forming material on at least one substrate in sheet form held within said vacuum evaporation chamber to form a stimulable phosphor layer, thereby producing said evaporated phosphor sheet having said stimulable phosphor layer formed on one substrate in sheet form, wherein said stimulable phosphor layer is formed with substantially all areas of said at least one evaporation source except opening for evaporation being masked to block movement of heat toward said one substrate in sheet form.

Preferably, said substantially all areas except said opening for evaporation are masked with a shielding plate that is cooled.

Preferably, said shielding plate is cooled by a cooling means provided on said shielding plate which employs water as a cooling medium.

Preferably, said at least one evaporation source is a resistance heated evaporation source.

Preferably, a degree of vacuum in said vacuum evaporation chamber is at 0.01–5.0 Pa, more preferably, at 0.1–2.0 Pa.

Moreover, according to the second aspect of the invention in order to attain the another object described above, there is provided an apparatus for producing a evaporated phosphor sheet, comprising: a vacuum evaporation chamber; means for introducing a carrier gas into said vacuum evaporation chamber; at least one evaporation source for evaporating at least one film forming material; means for holding at least one substrate in sheet form as provided within said vacuum evaporation chamber; and a heat shielding plate so provided as to cover substantially all areas of said at least one evaporation source except opening for evaporation, wherein said at least one film forming material as evaporated from said at least one evaporation source is deposited on said at least one substrate in sheet form to form a stimulable phosphor layer, thereby producing said evaporated phosphor sheet having said stimulable phosphor layer formed on one substrate in sheet form.

Preferably, said heat shielding plate has a cooling capability.

Preferably, said cooling capability is implemented by a cooling means provided on said heat shielding plate which employs water as a cooling medium.

Preferably, said at least one evaporation source is a resistance heated evaporation source.

Preferably, a degree of vacuum in said vacuum evaporation chamber is at 0.01–5.0 Pa, more preferably, at 0.1–2.0 Pa.

According to the third aspect of the invention in order to attain the still another object described above, there is provided an evaporated phosphor sheet comprising: a substrate in sheet form; and a CsBr:Eu evaporated stimulable phosphor layer deposited on the substrate in sheet form, wherein a maximum intensity of instantaneous light emission from said CsBr:Eu evaporated stimulable phosphor layer at 640 nm upon excitation by uv radiation is lower than a maximum intensity of the instantaneous light emission at 440 nm, and wherein said instantaneous light emission at 640 nm refers to a peak of the instantaneous light emission appearing around 630 nm–650 nm and said instantaneous light emission at 440 nm" to the peak of the instantaneous light emission appearing around 430 nm–450 nm.

Preferably, said stimulable phosphor layer is formed by the steps of introducing a carrier gas into a vacuum evaporation chamber in which substantially all areas of at least one evaporation source except opening for evaporation is masked, evaporating at least one film forming material consisting of CsBr and Eu from said at least one evaporation source, and depositing said at least one evaporated film forming material on a substrate in sheet form held within said vacuum evaporation chamber.

Preferably, a ratio of said maximum intensity of the instantaneous light emission at 640 nm to that at 440 nm is 0.25 or smaller.

Preferably, a ratio of said maximum intensity of the instantaneous light emission at 640 nm to that at 440 nm is 0.1 or smaller.

The cooling means may employ various kinds of cooling media that are used in common refrigerators, such as Freon substitutes, water, liquid nitrogen and liquid helium. In view of the need to satisfy both requirements for economy and heat capacity, water is considered the most preferred.

According to the third aspect of the invention, there is provided an evaporated phosphor sheet comprising a substrate in sheet form and a CsBr:Eu evaporated stimulable phosphor layer deposited on the substrate in sheet form, wherein a maximum intensity of the instantaneous light emission from the stimulable phosphor layer at 640 nm being lower than a maximum intensity of the instantaneous light emission at 440 nm. To give specific figures, the ratio of the emission intensity at 640 nm to that at 440 nm is preferably 0.25 or smaller, more preferably 0.1 or smaller.

The term "the instantaneous light emission at 640 nm" refers to the peak of instantaneous light emission appearing around 630 nm–650 nm and "the instantaneous light emission at 440 nm" to the peak of instantaneous light emission appearing around 430 nm–450 nm.

According to the invention, there are obtained two significant benefits, one providing a process for producing evaporated phosphor sheets with a protective measure being so taken that the heat of radiation from sections of evaporating film forming materials will affect neither the substrate on which a film is being deposited nor any other parts, thereby ensuring that the phosphor sheet as produced will not have been subjected to thermal history, and the other providing an apparatus for producing such evaporated phosphor sheets by implementing the aforementioned process.

As a further benefit, the evaporated phosphor sheets that are produced by the above-described process have a smaller noise component in the intensity of light emission.

DESCRIPTION OF THE PREFERRED EMBODIMENT

The preferred embodiment of the present invention is described below in detail with reference to the accompanying drawings.

Figure 1:
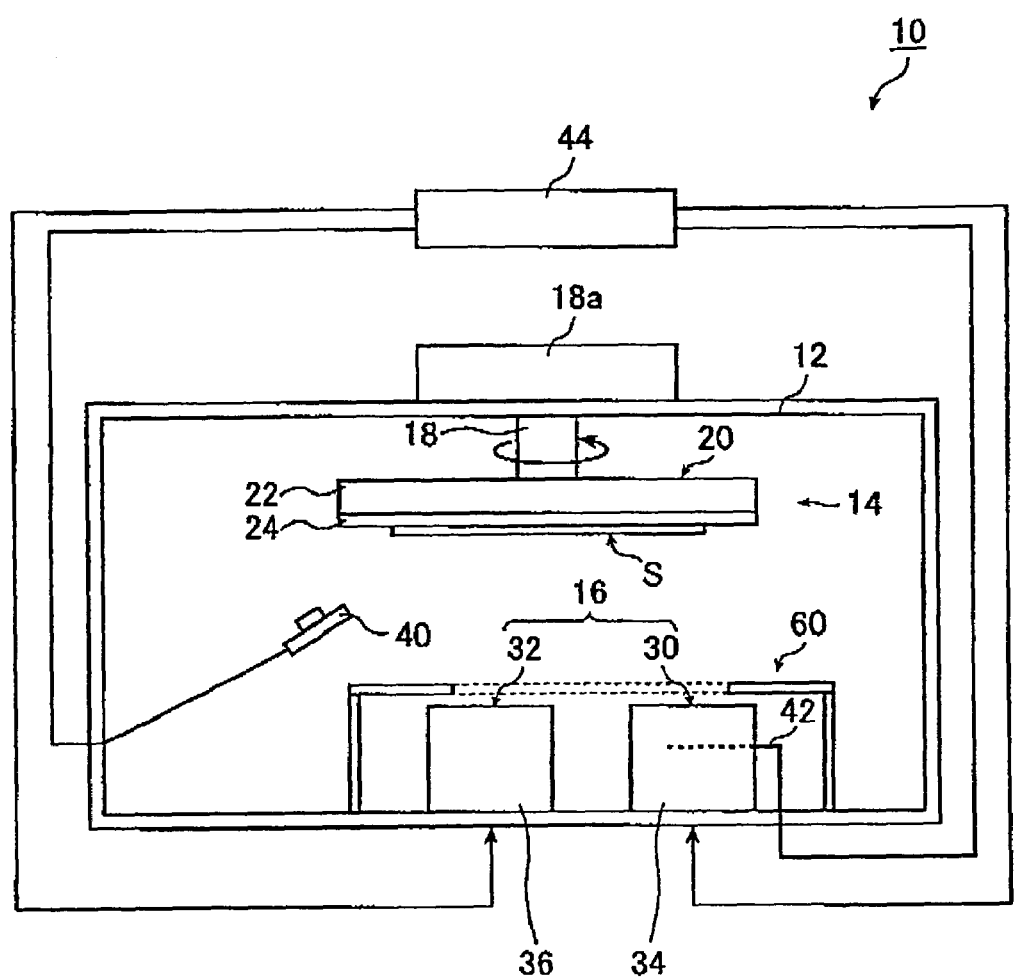
FIG. 1 is a schematic side view showing an outline for the construction of an apparatus for producing evaporated phosphor sheets according to an embodiment of the invention.

FIG. 1 is a schematic side view showing an outline for the construction of an apparatus, generally indicated by 10, for producing evaporated phosphor sheets according to an embodiment of the invention, which is hereunder sometimes referred to simply as the apparatus.

The apparatus 10 according to the embodiment under consideration is so designed that a stimulable phosphor layer is formed on a surface of a glass substrate S in sheet form by binary vacuum evaporation to prepare a phosphor sheet.

The apparatus 10 according to the embodiment under consideration is a vacuum evaporator of a so-called revolving substrate type which consists basically of a vacuum chamber 12, a substrate holding and rotating mechanism 14 and a heating/evaporating section 16. As will be described later, the apparatus 10 according to the embodiment under consideration has a heat shielding plate 60 in the vacuum chamber 12 for blocking the heat of radiation from the heating/evaporating section 16 toward the substrate.

The apparatus 10 according to the embodiment under consideration has additional components including a sensor in the vacuum chamber 12 for detecting the deposition rate of a film forming material, as well as a control means 44 for controlling the heating/evaporating section 16 on the basis of the result of detection with the sensor, and a vacuum pump (evacuating means), although not shown, for evacuating the interior of the vacuum chamber 12 to create a specified degree of vacuum. The apparatus is also connected to a gas introducing means for supplying the vacuum chamber 12 with a gas to be described later.

In an exemplary case, the apparatus 10 according to the embodiment under consideration performs binary vacuum evaporation using cesium bromide (CsBr) and europium bromide (EuBr$_x$: x is typically 2–3) as film forming materials to deposit a CsBr:Eu based stimulable phosphor layer on the glass substrate S, thereby preparing a phosphor sheet.

The stimulable phosphor is not limited to CsBr:Eu and various compositions may be employed. Preferred stimulable phosphors are those which, upon exposure to exciting light at wavelengths in the range of 400 nm–900 nm, produce photostimulated luminescence in a wavelength range of 300 nm–500 nm.

Particularly preferred are alkali metal halide based stimulable phosphors represented by the following basic compositional formula:

$$M^I X \cdot aM^{II}X'_2 \cdot bM^{III}X''_3 : zA$$

where $M^I$ is at least one alkali metal selected from the group consisting of Li, Na, K, Rb and Cs; $M^{II}$ is at least one alkaline earth metal or divalent metal selected from the group consisting of Be, Mg, Ca, Sr, Ba, Ni, Cu, Zn and Cd; $M^{III}$ is at least one rare earth element or trivalent metal selected from the group consisting of Sc, Y, La, Ce, Pr, Nd, Pm, Sm, Eu, Gd, Tb, Dy, Ho, Er, Tm, Yb, Lu, Al, Ga and In; A is at least one rare earth element or metal selected from the group consisting of Y, Ce, Pr, Nd, Sm, Eu, Gd, Tb, Dy, Ho, Er, Tm, Yb, Lu, Na, Mg, Cu, Ag, Tl and Bi; X, X' and X" are each at least one halogen selected from the group consisting of F, Cl, Br and I; a denotes a numeral in the range of $0 \leq a < 0.5$; b denotes a numeral in the range of $0 \leq b < 0.5$; and z denotes a numeral in the range of $0 \leq z < 1.0$.

In the basic compositional formula set forth above, $M^I$ preferably contains at least Cs and X preferably contains at least Br, with A being preferably Eu or Bi.

The metal halide based stimulable phosphor represented by the basic compositional formula set forth above may, depending on the need, have aluminum oxide, silicon dioxide, zirconium oxide or other metal oxide contained as an additive in amounts no greater than 0.5 moles per mole of $M^I$.

The film forming materials also are not limited in any particular way and phosphor containing materials as well as activator containing materials (or the activator itself) may be chosen as appropriate for the composition of the desired phosphor layer.

The vacuum chamber 12 is a known type such as a bell jar or a vacuum vessel that are formed of iron, stainless steel, aluminum, etc. and employed with vacuum evaporation apparatuses. In the illustrated case, the vacuum chamber 12 contains the substrate holding and rotating mechanism 14 in the upper part and the heating/evaporating section 16 in the lower part. Here, only one heating/evaporating section 16 is employed but two or more heating/evaporating sections 16 may of course be provided.

As already mentioned, the vacuum chamber 12 is connected to a vacuum pump not shown. The vacuum pump that can be used is not limited in any particular way, either, and various types used with vacuum evaporation apparatuses may be employed as long as they can attain the required ultimate degree of vacuum. To name just a few examples, an oil diffusion pump, a cryogenic pump and a turbo-molecular pump may be used, optionally in combination with an auxiliary device such as a cryogenic coil.

In the apparatus 10 according to the embodiment under consideration, the ultimate degree of vacuum that can be created within the vacuum chamber 12 is set to range from about $1 \times 10^{-5}$ Pa to about $1 \times 10^{-2}$ Pa. During evacuation, the water partial pressure in the atmosphere in the apparatus is preferably adjusted to $7.0 \times 10^{-3}$ Pa or below by a suitable means such as combination with a diffusion pump (or a turbo molecular pump or the like). In the next step, with the water partial pressure maintained at the indicated low level, an inert gas such as Ar, Ne or $N_2$ gas is introduced to adjust the degree of vacuum to about 0.01–5 Pa, preferably about 0.1–2 Pa.

By thusly introducing an inert gas such as Ar, Ne or $N_2$ gas, with the stated low water partial pressure being maintained, to establish a degree of vacuum between about 0.01 Pa and about 5 Pa, preferably between about 0.1 Pa and about 2 Pa, an evaporation environment with the medium degree of vacuum is created and this enables the formation of stimulable phosphor as orderly shaped columns (columnar structures), resulting in improved PSL (photostimulable luminescence) that is expected from the stimulable phosphor formed.

The substrate holding and rotating mechanism 14 which holds and rotates the substrate S consists of a rotating shaft 18 that engages a rotational drive source (motor) 18a and a turntable 20.

The turntable 20 is a disk consisting of the body 22 forming the upper part and a sheath heater 24 forming the lower part (which faces the heating/evaporating section 16), with the rotating shaft 18 fixed in the center in engagement with the motor 18a. The turntable 20 holds the substrate S on its lower surface (the lower surface of the sheath heater 24) in the position of the heating/evaporating section 16 to be described later, namely, in the positions where the film forming materials are evaporated, and it is rotated at a specified speed by means of the rotating shaft 18. As a phosphor layer is deposited on the substrate S, the sheath heater 24 heats the substrate S from the reverse side (opposite the side where the phosphor layer is being deposited).

The substrate S that can be used is not limited to any particular types and all kinds of substrates in sheet form that are employed in phosphor sheets may be adopted, as exemplified by those which are made of glass, ceramics, carbon, aluminum, PET (polyethylene terephthalate), PEN (polyethylene naphthalate), polyimide, etc.

The heating/evaporating section 16 is positioned in the lower part of the vacuum chamber 12.

As already mentioned, the illustrated apparatus 10 performs binary vacuum evaporation in which two film forming materials, cesium bromide (CsBr) and europium bromide (EuBr), are individually heated to evaporate. To this end, the heating/evaporating section 16 has a europium (Eu) evaporating subsection 30 and a cesium (Cs) evaporating subsection 32.

The Eu evaporating subsection 30 is so designed that europium bromide (activator material) contained in an evaporating position (crucible) is evaporated by resistance heating with a resistance heater 34. Details about the resistance heater 34 in the Eu evaporating subsection 30 will be given later.

The Cs evaporating subsection 32 is so designed that cesium bromide (matrix crystal material) contained in an evaporating position (crucible) is evaporated by resistance heating with a resistance heater 36. In the embodiment under consideration, the means for evaporating cesium bromide is not limited in any particular way and various heating/evaporating means can be employed as long as a phosphor layer that is mainly composed of a phosphor and which is thicker than 200 μm can be deposited at adequate rate.

Although not shown, material supply means are provided at the respective evaporating positions to supply the associated materials.

In the preparation of phosphor sheets, the activator is used in a very small amount compared to the phosphor and it is important to control the ingredients of the phosphor layer to be formed. To this end, it is preferred that the two film forming materials, one as the phosphor and one as the activator, are separately heated to generate their own vapors which form an intimate vapor mixture which, in turn, is deposited on the substrate S.

To this end, the evaporating positions of the phosphor material and the activator material are preferably set in proximity to each other and the smaller their distance, the more uniformly the activator will be dispersed to form a phosphor layer of better quality. What is more, the smaller the distance between the two evaporating positions, the broader the area where the two vapors can exist in admixture and, hence, the more efficient the utilization of the two materials.

As also mentioned above, the apparatus 10 according to the embodiment under discussion is provided with a sensor for detecting the deposition rate of a film forming material. In the illustrated case, a quartz oscillating monitor 40 is provided above the Cs evaporating subsection 32 as a sensor for detecting the deposition rate of the phosphor being evaporated from the Cs evaporating subsection 32.

The quartz oscillating monitor 40 is an oscillator which measures the thickness of an evaporated film by detecting a change that occurs in its oscillation characteristics with the progress of deposition on the sensor. A problem with such quartz oscillator is that measurement may become impossible if the film forming material is deposited in a certain amount. In order to prevent this problem, it is also effective to avoid excessive deposition of the film forming material on the quartz oscillator by providing a mask means that shields the quartz oscillator from the stream of the film forming material vaporized from the Cs evaporating subsection 32.

The deposition rate of europium being vaporized from the Cs evaporating subsection 30 is preferably calculated on the basis of its preliminarily measured proportion to the quantity of evaporation of cesium bromide. The reason is in the apparatus 10 according to the embodiment under consideration which, as already mentioned, is supplied with an inert gas, europium bromide is evaporated in such a small amount (about 3/1000 of the amount of cesium bromide to be evaporated) that it is difficult to measure.

Needless to say, the apparatus 10 may be so adapted as to monitor the deposition rate of europium being vaporized from the Eu evaporating subsection 30. In this alternative case, the aforementioned quartz oscillating sensor may preferably be replaced by a high-sensitivity temperature sensor (e.g. thermocouple) 42 in the Eu evaporating subsection 30, with the deposition rate of europium being controlled on the basis of a preliminarily measured deposition rate vs temperature profile.

As already mentioned, the apparatus 10 according to the embodiment under consideration is supplied with an inert gas, so the distance between the substrate S and each of the Eu evaporating subsection 30 and the Cs evaporating subsection 32 is made smaller than in the prior art. This is in order to ensure that the molecules of the inert gas present will not interfere with the movement of europium being vaporized, notably in a small quantity, from the Eu evaporating subsection 30 toward the substrate S, thereby promoting more efficient deposition of europium on the substrate S.

Note that, if the distance between the evaporating section (consisting of the Eu evaporating subsection 30 and the Cs evaporating subsection 32) and the substrate S is shortened, the heat of radiation released from the Eu evaporating subsection 30 or the Cs evaporating subsection 32 toward the substrate S is so markedly increased compared to the conventional case (where the distance between the evaporating section and the substrate S is large) that the thermal history imposed on the phosphor layer being deposited on the substrate S can no longer be neglected. In order to cope with this problem, the aforementioned heat shielding plate 60 is provided in the embodiment under consideration.

The basic function of the heat shielding plate 60 is to cover all areas where the heat of radiation is generated but for the exits of the materials' vapors coming from the evaporating section (the Eu evaporating subsection 30 and Cs evaporating subsection 32)—the exits being hereunder referred to simply as the openings for evaporation—so that the heat of radiation generated in the evaporating section will not flow toward the substrate S. To this end, the heat shielding plate 60 is specifically adapted to have a cooling capability by being formed as a disk which is made of a material of high thermal conductivity such as a copper plate and which is fitted on the back side (the underside remote from the substrate S) with a jacket unit typically comprising a copper pipe through which cold water flows.

Figure 2:
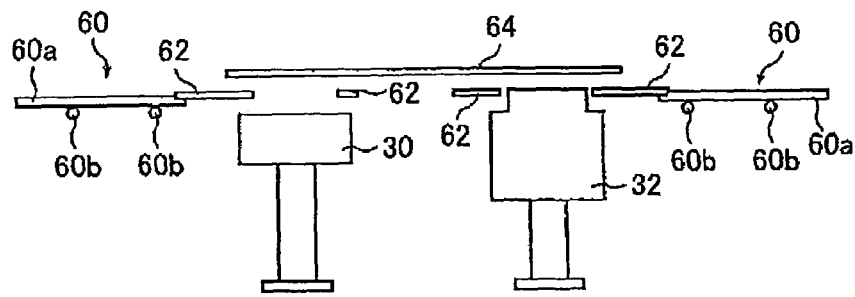
FIG. 2 is a longitudinal section illustrating the construction of a heat shield plate and an evaporation section consisting of a Eu evaporating subsection and a Cs evaporating subsection, as employed in the apparatus shown in FIG. 1.
Figure 3:
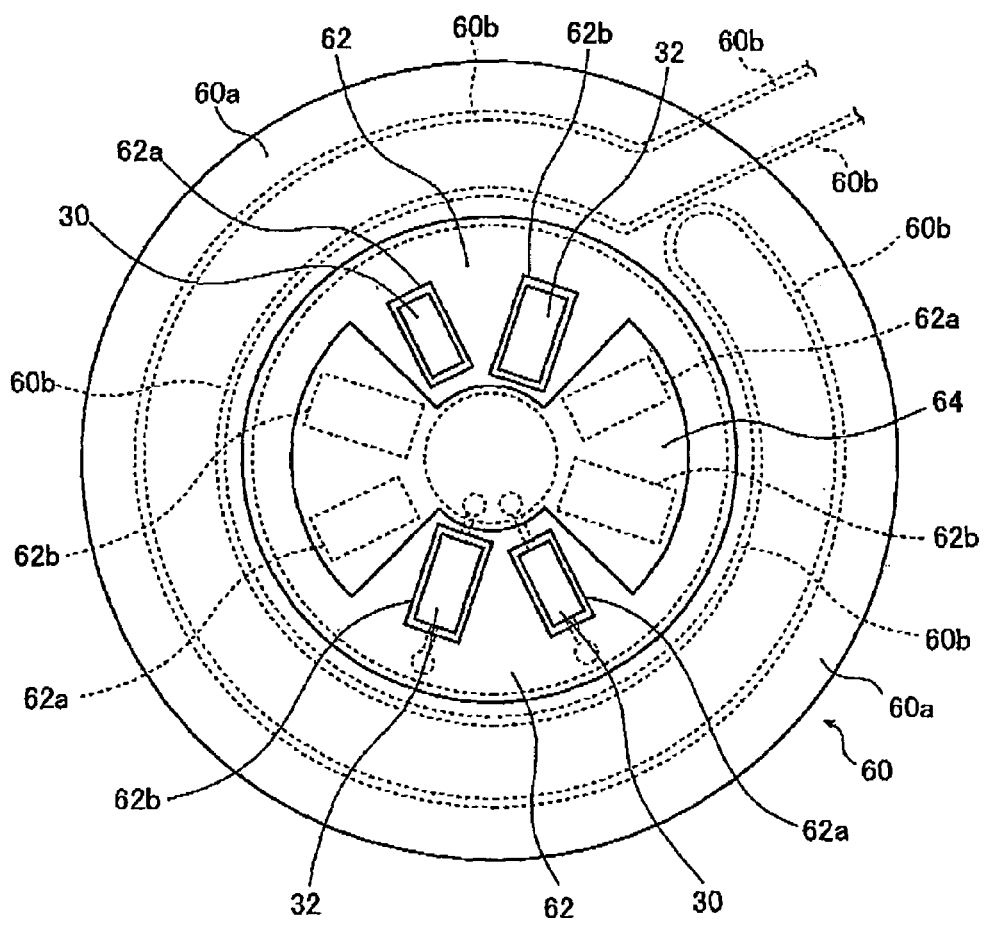
FIG. 3 is a plan view as a counterpart of FIG. 2.

On the following pages, a detailed structure of the heat shielding plate 60 is described specifically with reference to FIGS. 2 and 3. FIG. 2 is a longitudinal section illustrating the structures of the heat shielding plate 60 and the evaporating section (consisting of the Eu evaporating subsection 30 and the Cs evaporating subsection 32). FIG. 3 is a plan view which is a counterpart of FIG. 2. In each of FIGS. 2 and 3, those portions other than the heat shielding plate 60 and the evaporating section (consisting of the Eu evaporating subsection 30 ad the Cs evaporating subsection 32) which have no direct bearing on the present invention are omitted.

As already mentioned briefly above, the heat shielding plate 60 is a disk, with the center area bored through, which is formed of a material of high thermal conductivity such as a copper plate and which is fitted on the back side (the underside remote from the substrate S) with a jacket unit typically comprising a copper pipe through which cold water flows. As shown in FIGS. 2 and 3, the underside of a disk 60a formed of a copper plate is fitted, by welding or other method that permits efficient heat transfer, with a double coiled jacket unit 60b that is formed of a copper pipe and through which cold water flows.

Further speaking of the heat shielding plate 60, a mask 62 is placed in the bored center area of the disk 60a such that its outer edge sits on the inner edge of the disk 60a. The mask 62 is also made of a copper plate and sized such that its outer edge sits on the inner edge of the disk 60a. The mask 62 has at least two openings 62a and 62b that permit the passage of vapors. The opening 62a is associated with the Eu evaporating subsection 30 and the opening 62b with the Cs evaporating subsection 32. These openings conform to the shapes of the respective evaporating subsections.

The primary function of the mask 62 is such that changes in the shape and size of the evaporating section (the Eu evaporating subsection 30 or the Cs evaporating subsection 32) can be dealt with by simply replacing the mask 62 with another mask having a different shape and size so that there is no need to replace the disk 60a which is the major part of the heat shielding plate 60. To be more specific, remaking or replacing the disk 60a each time the shape and size of the evaporating section are altered is not advisable from an economical viewpoint. Instead, the mask 62 is physically separated from the disk 60a which is the major part of the heat shielding plate 60.

Considering this function of the mask 62, it is preferred that sufficient connection is established between the mask 62 and the disk 60a to provide the desired characteristics of heat transfer. To this end, it may be required that a sufficient allowance be provided for the area where the outer edge of the mask 62 sits on the inner edge of the disk 60a or that both the mask 62 and the disk 60a be processed to have a sufficient degree of flatness to minimize the gap between the two elements.

In short, the above-described designs are intended to ensure that in the case where not all of the preset evaporating sections (each consisting of the Eu evaporating subsection 30 and the Cs evaporating subsection 32) are employed, the movement of heat radiated from the operational evaporating sections (each consisting of the Eu evaporating subsection 30 and the Cs evaporating subsection 32) via the openings in the mask 62 is blocked by shield members of the simplest possible construction (in terms of size and shape). The illustrated case shows a specific example in which a plurality of masks 62 that correspond to all evaporating positions are employed in combination with a shutter 64 that covers some of the masks 62. However, this is not the only approach that can be taken in the present invention.

For example, the mask 62 may be prepared to come in a plurality of shapes that are so formed as to be associated with only those of the preset evaporating sections (each consisting of the Eu evaporating subsection 30 and the Cs evaporating subsection 32) which are located in particular positions and the operator may selectively employ those masks which correspond to the positions of the evaporating sections that are to be actually operated. In this case, the mask will also function as the aforementioned shutter 64.

Returning to FIG. 1, we will continue the explanation.

The apparatus 10 according to the embodiment under consideration is provided with the controller (deposition control means) 44 for controlling not only the Cs evaporating subsection 32 and the Eu evaporating subsection 30 but also the overall operation of the system taken as a whole. The apparatus 10 is so adapted that the results of detection with the aforementioned quartz oscillating monitor 40 (as well as the thermocouple 42 as a temperature sensor) are sent to the controller 44. On the basis of such detected data, the controller 44 controls the resistance heaters 36 and 34 in the Cs evaporating subsection 32 and the Eu evaporating subsection 30, respectively, so as to control the amounts of vaporization of the associated film forming materials.

It should be added that in the apparatus 10 according to the embodiment under consideration, the resistance heaters 34 and 36 in the Eu evaporating subsection 30 and the Cs evaporating subsection 32, respectively, are both in the form of a boat having a box-shaped cavity (crucible) and provided on a platform; the boats are heated directly by current impression, whereupon the film forming materials are heated to evaporate.

On the pages that follow, the method of depositing a phosphor layer with the apparatus 10 according to the embodiment under consideration is described in greater detail.

As already mentioned, the apparatus 10 according to the embodiment under consideration performs binary vacuum evaporation by resistance heating after introducing an inert gas. To prepare a phosphor sheet, glass as the substrate S is first mounted in a specified position on the underside of the turntable 20, with the side facing down where a film is to be deposited, and then the vacuum chamber 12 is closed and evacuated, followed by heating the glass substrate S from the back side with the sheath heater 24.

An inert gas such as Ar gas is introduced into the vacuum chamber 12 until its interior has a specified degree of vacuum, preferably between about 0.01 Pa and about 5 Pa, more preferably between about 0.1 Pa and about 2 Pa. When the interior of the vacuum chamber 12 has had the specified degree of vacuum, the turntable 20 is caused to rotate at a specified speed by means of the rotational drive source 18. Thus, with the glass substrate S being rotated at the specified speed, the deposition of a phosphor layer is started in the heating/evaporating section 16.

To describe the heating/evaporating section 16 more specifically, the resistance heater 34 in the Eu evaporating subsection 30 is driven to vaporize the europium bromide (EuBr) contained in the evaporating position (crucible); at the same time, the resistance heater 36 in the Cs evaporating subsection 32 is driven to vaporize the cesium bromide (CsBr) contained in the evaporating position, whereby the evaporation of CsBr:Eu onto the glass substrate S is started to deposit the desired phosphor layer.

Thus, vapor deposition by resistance heating involves applying an electric current to the resistance heaters so as to heat the evaporation sources. The evaporation sources, e.g. the matrix and activator components of the stimulable phosphor, are heated to vaporize and scatter. The two components react not only to form a phosphor but also to be deposited on a surface of the substrate. If vapor deposition is to be performed with an inert gas being introduced as in the embodiment under consideration, the use of resistance heaters is preferred.

As mentioned before, the Eu evaporating subsection 30 and the Cs evaporating subsection 32 are positioned in close proximity, so in the neighborhood of the heating/evaporating section 16, a vapor mixture of the two film forming materials in which the vapor of europium bromide (EuBr) is dispersed uniformly in a very small quantity and this vapor mixture enables vapor deposition of CsBr:Eu having the activator dispersed uniformly therein. In this process, as also mentioned before, the amounts of vapor deposition may be monitored and the amounts in which the respective film forming materials are evaporated may be controlled with the controller 44; as a result, the thickness of the phosphor layer being formed on the glass substrate S can be set at the correct value.

During vapor deposition, the temperature of the substrate S is typically in the range of from 0 to 300° C. and considering the effects of the aforementioned thermal history, the substrate's temperature is preferably in the range of from 50 to 150° C. In the embodiment under consideration, the aforementioned heat shielding plate 60, the mask 62 and other members combine to form the mechanism for blocking the heat of radiation from the evaporating section, which effectively adjusts the temperature of the substrate S to lie within the above-mentioned range of 50 to 150° C. For further details, see the Example that follows.

When the deposition of a specified film thickness ends, the turntable 20 is turned off and the vacuum in the vacuum chamber 12 is released and the glass substrate S on which the phosphor layer has been deposited is withdrawn. If continuous film deposition is necessary, the above-described procedure is repeated, namely, a virgin glass substrate S is mounted and the same process of film deposition is performed. The quartz oscillator on which the film forming materials have been deposited may be washed with water for another use.

The apparatus 10 according to the embodiment under consideration is so designed that the rates of vapor deposition of the respective film forming materials are controlled and at the same time the substrate temperature is maintained within the preferred range; this offers the advantage that the thickness of the phosphor layer can be controlled with high precision and, in addition, one can produce phosphor sheets having uniform and satisfactory x-ray characteristics.

The following example is provided for further illustrating the present invention but is in no way to be taken as limiting.

EXAMPLE

In the following example, the conditions of evaporating film forming materials were held constant whereas the mechanism of blocking the heat of radiation from the evaporating sections by employing the aforementioned heat shielding plate 60, mask 62, shutter 64, etc. was operated in three different modes. The surface temperature of the phosphor layers (films) formed in the respective modes, as well as the PSL (photostimulated luminescence) of the formed phosphor layers and the intensity ratio between 640 nm and 440 nm of instantaneous light emission upon excitation by uv radiation were measured for comparison purposes.

The following methods were employed to measure PSL and the intensity ratio of instantaneous light emission.

First, in PSL measurements, an X-ray (10 mR) was applied at a tube voltage of 80 Vp, followed by excitation with a semiconductor laser ($\lambda$=660 nm) to produce photostimulated luminescence; the light passing through a filter that would cut off the exciting light was measured with a photomultiplier tube (spectral sensitivity=S–5), thereby measuring the PSL around 440 nm.

For the measurement of the uv excited instantaneous light emission spectra from the stimulable phosphor layer, the uv excited spectrum of $Eu^{2+}$ was measured with a spectrofluorometer (Hitachi: F4500). The spectrofluorometer had been preliminarily corrected by the following procedure.

(1) Correction of the excitation wavelength: Rhodamine B having a virtually constant quantum efficiency for various test wavelengths was injected into a quartz cell and the excited spectrum of the light emission from Rhodamine B at 640 nm was measured with the photomultiplier tube set at a voltage of 400 V and at a scan speed of 60 nm/min, with the slits on the excitation and emission sides set at 5 nm and 20 nm, respectively; the correction coefficient for the excitation wavelength was so determined that the spectrum intensity would be constant at the various test wavelengths.

(2) Correction of the emission wavelength: A glass diffusion element having a virtually constant scattering intensity for various test wavelengths was measured for scattering spectra by scanning an excitation spectroscope and an emission spectroscope simultaneously at a scan speed of 60 nm/min, with the photomultiplier tube set at a voltage of 400 V and the slits on the excitation and emission sides set at 5 nm and 20 nm, respectively; the correction coefficient for the emission wavelength was so determined that scattering spectrum intensity would be constant at the various test wavelengths.

A sample stimulable phosphor layer was set on a holder and placed within the apparatus. The uv excited emission spectrum of $Eu^{2+}$ was measured with the photomultiplier tube set at a voltage of 400 V, the slits on the excitation and emission sides each set at 2.5 nm and the scan speed at 60 nm/min, and with the excitation wavelength set at 345 nm. For each of the emission spectra obtained, the peak values of the bands appearing around 430 nm–450 nm and around 630 nm–650 nm were read as the emission intensities of each emission spectrum.

Evaporation sources: A cesium bromide (CsBr) powder with a purity of at least 4N and a europium bromide ($EuBr_x$, where x is approximately 2.2) with a purity of at least 3N were provided. The trace elements in each powder were analyzed by ICP-MS (inductively coupled rf plasma emission spectrometry combined with mass spectrometry) showed that the alkali metals (Li, Na, K and Rb) except Cs in CsBr were each at 10 ppm and less, with other elements such as alkaline earth metals (Mg, Ca; Sr and Ba) being each at 2 ppm and less. The rare earth elements except Eu in $EuBr_x$ were each at 20 ppm and less, with other elements being each at 10 ppm and less.

Forming phosphor layers: A synthetic quartz substrate was successively washed with an alkali, pure water and IPA (isopropyl alcohol) to prepare a support, which was mounted on a substrate holder in a vapor deposition apparatus. The evaporating subsections according the above-described embodiment were loaded with CsBr and EuBr as film forming materials and the interior of the apparatus was evacuated to $8 \times 10^{-4}$ Pa. Thereafter, Ar gas was supplied into the apparatus until the degree of vacuum in it was 0.5 Pa. The substrate S was heated to 120° C. with a sheath heater and then vapor deposition was initiated. The heating with the sheath heater was stopped as the vapor deposition was started and subsequent heating was effected by the supply of heat from the vapor streams.

In the example under consideration, the distance between the substrate S and each evaporation source was held at 15 cm and a CsBr:Eu stimulable phosphor was deposited on the substrate S at a rate of 10 μm/min. During the deposition, the electric current to each heater was so adjusted that the ratio of Eu to Cs molar concentration in the stimulable phosphor would be $0.003/1$.

The mechanism of blocking the heat of radiation from the evaporating subsections was operated in the following three modes:

(1) no heat shielding plate;
(2) only the heat shielding plate 60 was used as it was cooled with water; and
(3) the heating shielding plate 60 (water cooled) was used in combination with the mask 62.

The results are shown below in Table 1.

TABLE 1

| | Characteristics | | |
|---|---|---|---|
| Condition | Film surface temperature | PSL (at ca. 440 nm) | Instantaneous light emission's intensity ratio |
| (1) No heat shielding plate | >250° C. | 60 | 0.1 |
| (2) Heat shielding plate was used | <250° C. | 120 | 0.01 |
| (3) Both heat shielding plate and mask were used | <200° C. | 180 | Not detected |

As Table 1 shows, the surface temperature of the stimulable phosphor layer (film) formed exceeded 250° C. in the case of (1) where no heat shielding plate was used. The photostimulated luminescence (the above-defined PSL) was 60 and the intensity ratio between the uv excited instantaneous light emission produced at 640 nm in the presence of thermal history and the uv excited instantaneous light emission at 440 nm (the ratio is hereunder referred to as the instantaneous light emission's intensity ratio) was 0.1.

In the case of (2) where only the heat shielding plate 60 was used as it was cooled with water, the film surface temperature dropped to below 250° C. and the PSL improved to 120. In addition, the instantaneous light emission's intensity ratio was 0.01, only one tenth of the value for the case where no heat shielding plate was used.

In the case of (3) where the heat shielding plate 60 (water cooled) was combined with the mask 62, the film surface temperature further dropped to below 200° C. and the PSL further improved to 180. There was no detection of the instantaneous light emission's intensity ratio, that is, the light emission at 640 nm was virtually absent.

As is clear from the data shown in Table 1, the process of the present invention for producing evaporated phosphor sheets offers advantages highly valuable from a practical viewpoint in that phosphor sheets having superior X-ray characteristics and which are capable of efficient photostimulation can be easily produced without suffering thermal history.

It should be noted that the above-described embodiment and example are simply provided for illustrative purposes only and are by no means intended to limit the invention. Hence, appropriate alterations or modifications can of course be made without departing from the spirit and scope of the invention.

For instance, the Eu evaporating subsection 30 and the Cs evaporating subsection 32 in the section 16 for heating and evaporating film forming materials are preferably so constructed (shaped) as to minimize the heat dissipation. To this end, an effective way is by reducing the area of openings to the necessary minimum level while at the same time the traveling direction of vapors is so bent that the heat of radiation will not directly affect the substrate. More specifically, it is effective to adopt a design in which a lid is provided on top of each of the Eu evaporating subsection 30 and the Cs evaporating subsection 32 and the film forming materials are allowed to evaporate through the surrounding gaps.

As described in detail in connection with the heat shielding plate 60, mask 62 and the shutter 64, the illustrated embodiment is such that the mask 62 determines the settings of use or non-use mode for all evaporating sections whereas the shutter 64 is adapted to cover some of the evaporating sections in use or operational mode. In actual case, the mask 62 may be so modified that it also serves as the shutter 64 (i.e., enables selective setting of operational evaporating sections). It is preferred to choose an optimal configuration and combination depending on a specific embodiment of use.

What is claimed is:

1. A process for producing an evaporated phosphor sheet, comprising the steps of:
    introducing a carrier gas into a vacuum evaporation chamber;
    evaporating at least one film forming material from at least one evaporation source among plural evaporation sources; and
    depositing said at least one evaporated film forming material on at least one substrate in sheet form held within said vacuum evaporation chamber to form a stimulable phosphor layer, thereby producing said evaporated phosphor sheet having said stimulable phosphor layer formed on one substrate in sheet form,
    wherein said stimulable phosphor layer is formed with substantially all areas of the remainder of said plural evaporation sources except said at least one evaporation source being masked to block movement of heat toward said one substrate in sheet form.

2. The process according to claim 1, wherein said substantially all areas of the remainder of said plural evaporation sources are masked with a heat blocking mechanism that is cooled.

3. The process according to claim 2, wherein said heat blocking mechanism includes a shielding plate that is cooled.

4. The process according to claim 3, wherein said shielding plate is cooled by a cooling means provided on said shielding plate which employs water as a cooling medium.

5. The process according to claim 1, wherein said at least one evaporation source is a resistance heated evaporation source.

6. The process according to claim 1, wherein a degree of vacuum in said vacuum evaporation chamber is at 0.01–5.0 Pa.

7. The process according to claim 1, wherein a degree of vacuum in said vacuum evaporation chamber is at 0.1–2.0 Pa.

8. An apparatus for producing an evaporated phosphor sheet, comprising:
    a vacuum evaporation chamber;
    means for introducing a carrier gas into said vacuum evaporation chamber;
    plural evaporation sources including at least one evaporation source for evaporating at least one film forming material;
    means for holding at least one substrate in sheet form as provided within said vacuum evaporation chamber; and
    a heat blocking mechanism so provided as to cover substantially all areas of the remainder of said plural evaporation sources except said at least one evaporation source,
    wherein said at least one film forming material as evaporated from said at least one evaporation source is deposited on said at least one substrate in sheet form to form a stimulable phosphor layer, thereby producing said evaporated phosphor sheet having said stimulable phosphor layer formed on one substrate in sheet form.

9. The apparatus according to claim 8, wherein said heat blocking mechanism includes a heat shielding plate having a cooling capability.

10. The apparatus according to claim 9, wherein said cooling capability is implemented by a cooling means provided on said heat shielding plate which employs water as a cooling medium.

11. The apparatus according to claim 9,
wherein said heat shielding plate includes a disk through which a center area is bored, and
wherein said heat blocking mechanism further includes a mask that is placed in the bored center area of said disk and has respective openings of said plural evaporation sources that permit passage of vapor of said at least one film forming material and a shutter that covers respective openings of the remainder of said plural evaporation sources except at least one opening of said at least one evaporation source.

12. The apparatus according to claim 11, wherein said heat shielding plate further includes a jacket unit with which said disk is fitted and through which cold water flows.

13. The apparatus according to claim 8, wherein said at least one evaporation source is a resistance heated evaporation source.

14. The apparatus according to claim 8, wherein a degree of vacuum in said vacuum evaporation chamber is at 0.01–5.0 Pa.

15. The apparatus according to claim 8, wherein a degree of vacuum in said vacuum evaporation chamber is at 0.1–2.0 Pa.

16. An evaporated phosphor sheet comprising:
a substrate in sheet form; and
a CsBr:Eu evaporated stimulable phosphor layer deposited on the substrate in sheet form,
wherein a maximum intensity of instantaneous light emission from said CsBr:Eu evaporated stimulable phosphor layer at 640 nm upon excitation by uv radiation is lower than a maximum intensity of the instantaneous light emission at 440 nm, and
wherein said instantaneous light emission at 640 nm refers to a peak of the instantaneous light emission appearing around 630 nm–650 nm and said instantaneous light emission at 440 nm refers to the peak of the instantaneous light emission appearing around 430 nm–450 nm,
wherein said stimulable phosphor layer is formed by the steps of introducing a carrier gas into a vacuum evaporation chamber in which substantially all areas of the remainder of plural evaporation sources except at least one evaporation source are masked, evaporating at least one film forming material consisting of CsBr and Eu from said at least one evaporation source, and depositing said at least one evaporated film forming material on a substrate in sheet form held within said vacuum evaporation chamber.

17. The phosphor sheet according to claim 16, wherein a ratio of said maximum intensity of the instantaneous light emission at 640 nm to that at 440 nm is 0.25 or smaller.

18. The phosphor sheet according to claim 16, wherein a ratio of said maximum intensity of the instantaneous light emission at 640 nm to that at 440 nm is 0.1 or smaller.

19. The phosphor sheet according to claim 16, wherein a ratio of said maximum intensity of the instantaneous light emission at 640 nm to that at 440 nm is smaller than 0.1.

20. The phosphor sheet according to claim 16, wherein a ratio of said maximum intensity of the instantaneous light emission at 640 nm to that at 440 nm is 0.01 or smaller.

21. The phosphor sheet according to claim 16, wherein a photo-stimulable luminescence of said CsBr:Eu evaporated stimulable phosphor layer at around 440 nm is larger than 60.

22. The phosphor sheet according to claim 16, wherein a photo-stimulable luminescence of said CsBr:Eu evaporated stimulable phosphor layer at around 440 nm is 120 or larger.

* * * * *